United States Patent
Hayashida et al.

(10) Patent No.: US 8,658,118 B2
(45) Date of Patent: Feb. 25, 2014

(54) HIGH PURITY CRYSTALLINE SILICON, HIGH PURITY SILICON TETRACHLORIDE FOR PROCESSES FOR PRODUCING THE SAME

(75) Inventors: Satoshi Hayashida, Kumamoto (JP); Wataru Kato, Kumamoto (JP)

(73) Assignees: JNC Corporation, Tokyo (JP); JX Nippon Mining & Metals Corporation, Tokyo (JP); Toho Titanium Co., ltd., Kanagawa (JP)

(*) Notice: Subject to any disclaimer, the term of this patent is extended or adjusted under 35 U.S.C. 154(b) by 464 days.

(21) Appl. No.: 13/060,669

(22) PCT Filed: Sep. 4, 2009

(86) PCT No.: PCT/JP2009/065485
§ 371 (c)(1),
(2), (4) Date: Feb. 24, 2011

(87) PCT Pub. No.: WO2010/029894
PCT Pub. Date: Mar. 18, 2010

(65) Prior Publication Data
US 2011/0158885 A1    Jun. 30, 2011

(30) Foreign Application Priority Data

Sep. 9, 2008 (JP) .................................. 2008-230627

(51) Int. Cl.
*C01B 33/08* (2006.01)
(52) U.S. Cl.
USPC ........... 423/342; 423/345; 423/335; 423/341; 423/350; 423/245.1; 117/200; 117/85; 117/109; 117/86; 117/87; 117/88; 117/89; 438/479; 438/488
(58) Field of Classification Search
None
See application file for complete search history.

(56) References Cited

U.S. PATENT DOCUMENTS

| | | | |
|---|---|---|---|
| 2,804,377 A | 8/1957 | Olson | 23/223.5 |
| 2,805,133 A | 9/1957 | Olson | 23/223.5 |

(Continued)

FOREIGN PATENT DOCUMENTS

| | | |
|---|---|---|
| JP | 2867306 | 6/1993 |
| JP | H08-259211 | 10/1996 |

(Continued)

OTHER PUBLICATIONS

European extended Search Report of European Application No. 09 81 3040, dated Nov. 18, 2011.

*Primary Examiner* — Patricia L Hailey
*Assistant Examiner* — Smita Patel
(74) *Attorney, Agent, or Firm* — J.C. Patents

(57) ABSTRACT

An object of the present invention is to provide more inexpensive high purity crystalline silicon which can satisfy not only a quality required to a raw material of silicon for a solar cell but also a part of a quality required to silicon for an up-to-date semiconductor and a production process for the same and provide high purity silicon tetrachloride used for production of high purity crystalline silicon and a production process for the same. The high purity crystalline silicon of the present invention has a boron content of 0.015 ppmw or less and a zinc content of 50 to 1000 ppbw. The production process for high purity crystalline silicon according to the present invention is characterized by that a silicon tetrachloride gas and a zinc gas are supplied to a vertical reactor to react them at 800 to 1200° C., whereby crude crystalline silicon is formed at a chip part of a silicon tetrachloride gas-supplying nozzle, and the crude crystalline silicon is grown downward from the chip part of the silicon tetrachloride gas-supplying nozzle; the grown crude crystalline silicon is discharged to an outside of the reactor, and the discharged crude crystalline silicon is subjected to acid treatment.

4 Claims, 1 Drawing Sheet

(56) References Cited

U.S. PATENT DOCUMENTS

| | | | | |
|---|---|---|---|---|
| 3,012,862 A | 12/1961 | Bertrand et al. | | 23/223.5 |
| 3,041,145 A | 6/1962 | Aries | | 23/223.5 |
| 2006/0042539 A1 | 3/2006 | Ohta | | 117/13 |
| 2007/0123011 A1 * | 5/2007 | Honda et al. | | 438/488 |

FOREIGN PATENT DOCUMENTS

| | | |
|---|---|---|
| JP | 2003-034519 | 2/2003 |
| JP | 2003-342016 | 12/2003 |
| JP | 2004-149351 | 5/2004 |
| JP | 2005-179183 | 7/2005 |
| JP | 2006-062948 | 3/2006 |
| JP | 2006-100255 | 4/2006 |
| JP | 2007-055891 | 3/2007 |
| JP | 2007-126342 | 5/2007 |
| JP | 2007-145663 | 6/2007 |

* cited by examiner

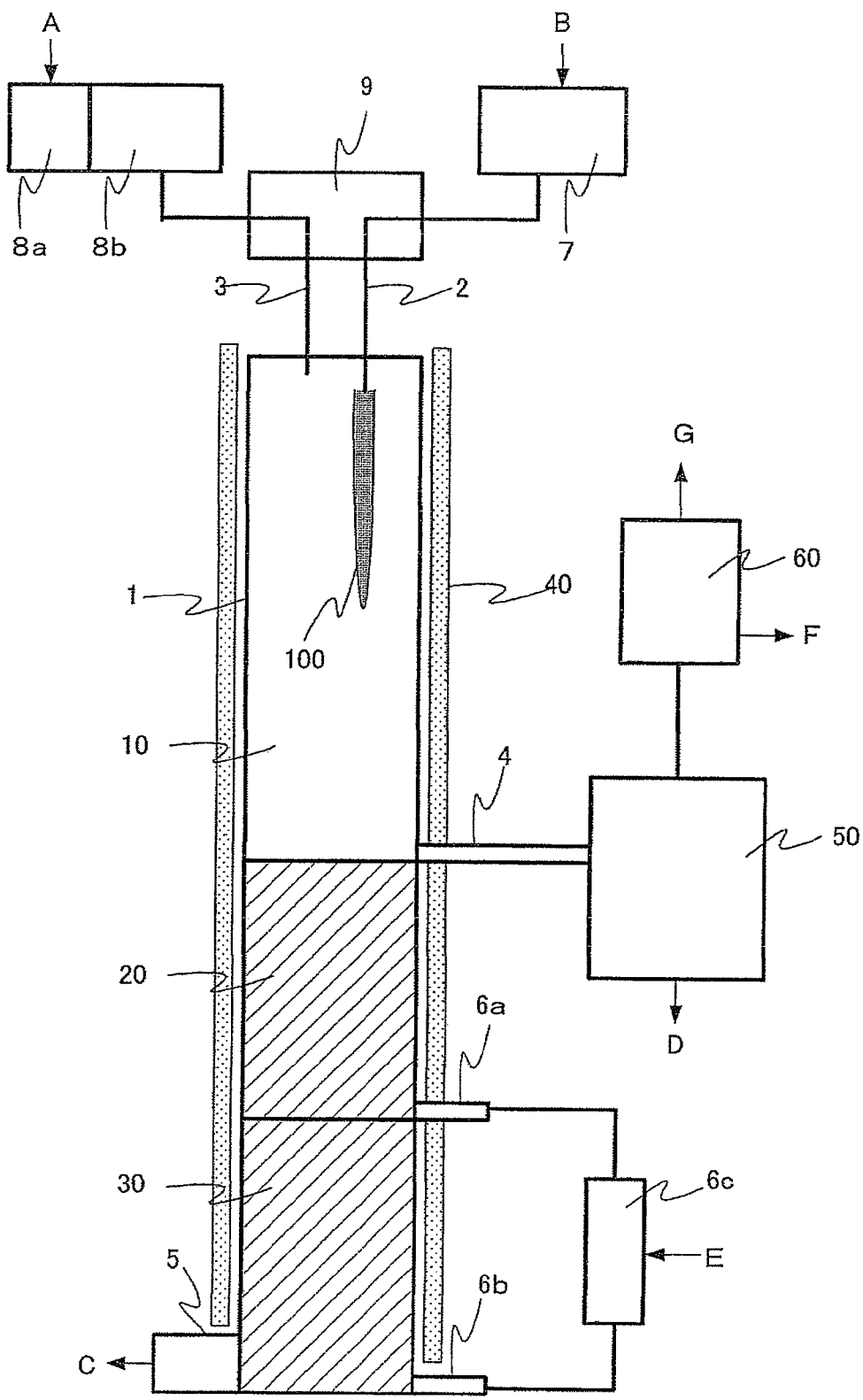

HIGH PURITY CRYSTALLINE SILICON, HIGH PURITY SILICON TETRACHLORIDE FOR PROCESSES FOR PRODUCING THE SAME

TECHNICAL FILED

The present invention relates to high purity crystalline silicon used for silicon for a solar cell and silicon for a semiconductor and a production process for the same, and it relates as well to high purity silicon tetrachloride used for production of high purity crystalline silicon and a production process for the same.

BACKGROUND ART

High purity crystalline silicon is used as a raw material of silicon for a solar cell and a raw material of silicon for a semiconductor. Particularly in recent years, the situation that popularization of solar cells is being expanded to a large extent is followed by that demand to high purity crystalline silicon, which is a raw material of solar cells increases as well.

The existing situation is that a residue remaining in a crucible after pulling up silicon for a semiconductor and scraps such as wastes generated in cutting silicon ingots are used as high purity crystalline silicon, which is a raw material of silicon for a solar cell. Accordingly, high purity crystalline silicon used for a solar cell depends on the trend of the semiconductor industry in terms of a quality and a quantity, and as a result thereof, it resides in the situation that it is chronically short.

A representative process for producing high purity crystalline silicon which is a raw material of silicon for a semiconductor includes a Siemens process. In this Siemens process, high purity crystalline silicon is obtained by hydrogen reduction of trichlorosilane ($HSiCl_3$) (refer to, for example, a patent document 1). In a general Siemens process, a seed bar of silicon is set in a bell jar type reactor cooled with water, and an electric current is applied to this seed bar of silicon to heat the seed bar to about 1000° C.; trichlorosilane ($HSiCl_3$) and a hydrogen ($H_2$) of a reducing agent are introduced into the reactor to reduce silicon chloride, and silicon produced is adhered selectively onto a surface of the seed bar, whereby bar-like crystalline silicon is obtained. In addition to the advantage that the raw material gas is vaporized at a relatively low temperature, the above Siemens process has the advantage in terms of an apparatus that since the reactor itself is cooled with water, the environment is readily sealed, and therefore it has so far widely been popularized and employed.

In the Siemens process, however, the seed bar is heated by applying an electric current, and therefore as bar-like silicon grows by adhesion of crystalline silicon produced by reductive reaction to allow an electric resistance to go down gradually, a large amount of electricity has to be applied in order to heat the seed bar. Accordingly, the growth limit is present due to balance with the energy cost, and the production facilities are operated by a batch system, so that involved therein are the problems that the production efficiency is inferior and that an electric power consumption rate accounts for a large proportion in a cost of high purity crystalline silicon, which is the product. Further, special facilities such as a reactor for exclusive use, an equipment for pulling up the crystal, a cutting equipment and the like and special techniques are required in preparing the seed bar, and therefore the seed bar itself becomes expensive.

A process for producing crystalline silicon other than the Siemens process includes, for example, a process for producing it by reduction of silicon tetrachloride ($SiCl_4$) using a metal reducing agent (refer to, for example, patent documents 2 and 3). To be specific, it is a process in which gases of silicon tetrachloride and zinc (Zn) are supplied into a quarts-made lateral reactor heated to about 1000° C. to thereby grow crystalline silicon in the reactor.

Based on the assumption of enabling to separate zinc chloride ($ZnCl_2$) by-produced in the process described above into zinc and chlorine by electrolysis and the like, use again zinc obtained as a reducing agent, react chlorine obtained with metal silicon to synthesize silicon tetrachloride and use it as a raw material gas, a process of a circulating type is constituted, and therefore provided is the possibility that crystalline silicon can be produced at a low cost However, involved in the above process are the problems that the crystalline silicon obtained by the reaction grows on a wall of the reactor and therefore is susceptible to an influence of contamination exerted by the reactor and that the reactor itself is broken due to a difference in a thermal expansion coefficient between the reactor and the crystalline silicon. Accordingly, the above process has scarcely been carried out in an industrial scale. A production process in which a vertical reactor is used to inhibit an influence of contamination exerted by a material of the reactor is proposed (refer to, for example, a patent document 4), and this has enhanced a purity of crystalline silicon produced by reduction of silicon tetrachloride ($SiCl_4$) to a large extent. However, requirements to a purity of crystalline silicon are further elevated in every application field, and desired are a rise in a quality of the raw materials such as silicon tetrachloride and metal zinc which are used for reduction and further improvement in the process for producing crystalline silicon and the respective steps related to the quality, such as a method for washing crystalline silicon.

PRIOR ART

Patent Documents

Patent document 1: Japanese Patent No. 2867306
Patent document 2: Japanese Patent Application Laid-Open No. 2003-34519
Patent document 3: Japanese Patent Application Laid-Open No. 2003-342016
Patent document 4: Japanese Patent Application Laid-Open No. 2007-145663

SUMMARY OF THE INVENTION

Subject to be Solved by the Invention

An object of the present invention is to provide more inexpensive high purity crystalline silicon which can satisfy not only a quality required to a raw material of silicon for a solar cell but also a part of a quality required to a raw material of silicon for an up-to-date semiconductor and production process for the same and provide high purity silicon tetrachloride used for production of high purity crystalline silicon and a production process for the same.

Means for Solving the Subject

The present inventors have repeated intense researches in order to solve the problems described above. As a result thereof, they have found that a quality required to high purity single crystalline silicon prepared is satisfied by using high purity crystalline silicon having a boron content of 0.015 ppmw or less and a zinc content of 50 to 1000 ppbw; the above high purity crystalline silicon is obtained by reducing a high purity silicon tetrachloride gas containing boron and an organic silicon compound in specific contents or less with a zinc gas by means of a vertical reactor to obtain crystalline silicon (hereinafter referred to as "crude crystalline silicon") and subjecting it to acid treatment; and the above high purity silicon tetrachloride is obtained by further subjecting silicon tetrachloride industrially obtained to adsorption treatment to thereby treat a boron compound and subjecting it to carbonization treatment to thereby treat an organic silicon compound. Thus, they have come to complete the present invention based on the above knowledges.

The present invention comprises, for example, the following constitutions.

[1] High purity crystalline silicon having a boron content of 0.015 ppmw or less and a zinc content of 50 to 1000 ppbw.

[2] High purity single crystalline silicon having a carbon content of 2 ppmw or less and a resistivity value $\rho$ of 20 to 1000 $\Omega$-cm, wherein it is prepared from the high purity crystalline silicon as described in the item [1].

[3] The high purity single crystalline silicon as described in the item [2], wherein it is obtained by a Czochralski process using the high purity crystalline silicon as a raw material.

[4] A production process for high purity crystalline silicon, which is a process for producing the high purity crystalline silicon as described in the item [1], comprising:
(1) a step in which in a vertical reactor equipped with a silicon tetrachloride gas-supplying nozzle, a zinc gas-supplying nozzle and a waste gas-discharging pipe, the silicon tetrachloride gas-supplying nozzle being inserted into an inside of the reactor from an upper part thereof and set therein, a silicon tetrachloride gas is supplied from the silicon tetrachloride gas-supplying nozzle and a zinc gas is supplied from the zinc gas-supplying nozzle,
(2) a step in which the silicon tetrachloride gas is reacted with the zinc gas at 800 to 1200° C. to thereby form crude crystalline silicon at a chip part of the silicon tetrachloride gas-supplying nozzle,
(3) a step in which the crude crystalline silicon is grown downward from the chip part of the silicon tetrachloride gas-supplying nozzle,
(4) a step in which the grown crude crystalline silicon is discharged to an outside of the vertical reactor and
(5) a step in which the discharged crude crystalline silicon is subjected to acid treatment,
wherein high purity silicon tetrachloride having an organic silicon compound content of 0.1 ppmw or less and a boron content of 0.1 ppbw or less is used as a raw material of the silicon tetrachloride gas, and metal zinc having a purity of 99.99% by weight or more is used as a raw material of the zinc gas.

[5] The production process for high purity crystalline silicon as described in the item [4], wherein the step (5) comprises a step for crushing the discharged crude crystalline silicon, a step for subjecting the crushed crude crystalline silicon to acid treatment, a step for washing the acid-treated product and a step for drying the washed product.

[6] The production process for high purity crystalline silicon as described in the item [4] or [5], wherein the step (5) comprises a step for subjecting the crude crystalline silicon crushed to a particle diameter of 0.1 to 5 mm to acid treatment and a step for washing the acid-treated product with purified water.

[7] High purity silicon tetrachloride having an organic silicon compound content of 0.1 ppmw or less and a boron content of 0.1 ppbw or less.

[8] A production process for high purity silicon tetrachloride which is a process for producing the high purity silicon tetrachloride as described in the item [7], wherein metal silicon for industrial use is reacted with hydrogen chloride and/or chlorine, and the reaction product is distilled to thereby obtain silicon tetrachloride; and it is subjected to treatment for reducing a boron compound content and treatment for reducing an organic silicon compound content.

Effects of the Invention

The high purity crystalline silicon of the present invention satisfies quality characteristics required to a raw material of silicon for a solar cell, which is used for high purity single crystalline silicon (ingot) and high purity polycrystalline silicon (ingot). Further, it satisfies as well a part of a quality required to a raw material of silicon for an up-to-date semiconductor. Also, the high purity silicon tetrachloride having a low boron content and a low organic silicon compound content according to the present invention actualizes a low boron content and a low carbon content which are necessary for high purity crystalline silicon and high purity single crystalline silicon.

In the production process for high purity crystalline silicon according to the present invention, the by-products are cyclically-used passing through a separating step and a regenerating step; fewer wastes are discharged; and the facilities are simple and economically excellent.

BRIEF DESCRIPTION OF DRAWINGS

FIG. 1 is a schematic drawing of an apparatus for producing crude crystalline silicon by reduction of silicon tetrachloride with zinc.

EMBODIMENT FOR CARRYING OUT THE INVENTION

The high purity crystalline silicon and the production process for the same according to the present invention shall be explained below in detail.
[High Purity Crystalline Silicon]

The high purity crystalline silicon of the present invention has a boron content of 0.015 ppmw or less, preferably 0.010 ppmw or less and a zinc content of 50 to 1000 ppbw, preferably 50 to 500 ppbw. If a boron content and a zinc content of the high purity crystalline silicon fall within the ranges, the high purity crystalline silicon can satisfy not only a quality required to a raw material of silicon for a solar cell but also a part of a quality required to a raw material of silicon for an up-to-date semiconductor.

A cross section of a (111) face in the high purity crystalline silicon of the present invention has a diameter of preferably 0.1 to 5 mm from the viewpoint of readily carrying out acid treatment described later.
[Production Process for High Purity Crystalline Silicon]

The production process for high purity crystalline silicon according to the present invention comprises (1) a step in which in a vertical reactor equipped with a silicon tetrachloride gas-supplying nozzle, a zinc gas-supplying nozzle and a waste gas-discharging pipe, the silicon tetrachloride gas-supplying nozzle being inserted into an inside of the reactor from an upper part thereof and set therein, a silicon tetrachloride gas is supplied from the silicon tetrachloride gas-supplying nozzle and a zinc gas is supplied from the zinc gas-supplying nozzle, (2) a step in which the silicon tetrachloride gas is reacted with the zinc gas at 800 to 1200° C. to thereby form crude crystalline silicon at a chip part of the silicon tetrachloride gas-supplying nozzle, (3) a step in which the crude crystalline silicon is grown downward from the chip part of the silicon tetrachloride gas-supplying nozzle, (4) a step in which the grown crude crystalline silicon is discharged to an outside of the vertical reactor and (5) a step in which the discharged crude crystalline silicon is subjected to acid treatment.

The vertical reactor is, as shown in the schematic drawing of FIG. 1, equipped with a silicon tetrachloride gas-supplying nozzle 2, a zinc gas-supplying nozzle 3 and a waste gas-discharging pipe 4, and the silicon tetrachloride gas-supplying nozzle 2 and the zinc gas-supplying nozzle 3 are inserted into an inside of the reactor from an upper part thereof and set therein. A setting position of the waste gas-discharging pipe 4 shall not specifically be restricted as long as it does not disturb the crude crystalline silicon to be discharged to an outside of the reactor, and it is set preferably at a lower part of the reactor or on a side face at a middle part thereof. Meanwhile, a nozzle for supplying a carrier gas such as a nitrogen gas and the like in addition to the silicon tetrachloride gas-supplying nozzle and the zinc gas-supplying nozzle may be provided at an upper part of the vertical reactor.

A size of the vertical reactor shall not specifically be restricted, and it has preferably a diameter of 200 mm or more from the viewpoint of formation and growth of the crude crystalline silicon and a length of 500 to 5000 mm which is a length required for growth of the crude crystalline silicon and which is required for receiving the crude crystalline silicon formed.

In the vertical reactor, the silicon tetrachloride gas-supplying nozzle is preferably inserted perpendicularly from an upper part of the reactor and set therein so that a perpendicular line thereof is apart by a distance of 50 mm or more from a wall of the reactor from the viewpoint of formation and growth of the crude crystalline silicon. A bore diameter of the silicon tetrachloride gas-supplying nozzle, a wall thickness thereof and an insertion length thereof into the reactor shall not specifically be restricted, and considering formation and growth of the crude crystalline silicon, they are set preferably to a bore diameter of 10 to 100 mm, a wall thickness of 2 to 15 mm and an insertion length of 0 to 500 mm into the reactor. Further, a bore diameter of the zinc gas-supplying nozzle, a wall thickness thereof and an insertion length thereof into the reactor are the same as described above.

Materials having a durability in a use temperature range, for example, quartz, silicon carbide and the like can be listed as the materials of the production facilities such as the vertical reactor and the like which are used in the present invention. Also, stainless can be used as a material of a site in which the crude crystalline silicon formed is cooled and discharged.

The respective steps in the production process for high purity crystalline silicon according to the present invention shall be explained below in detail.

<Step (1)>

In the present step, a silicon tetrachloride gas is supplied from the silicon tetrachloride gas-supplying nozzle into the vertical reactor, and a zinc gas is supplied from the zinc gas-supplying nozzle thereinto.

In the present invention, high purity silicon tetrachloride having an organic silicon compound content of preferably 0.1 ppmw or less, more preferably 0.01 ppmw or less which is a detection limit and a boron content of preferably 0.1 ppbw or less, more preferably 0.05 ppbw or less which is a detection limit is preferably used as the raw material of the silicon tetrachloride gas in order to realize the purity of the high purity crystalline silicon.

Silicon tetrachloride which is industrially used is obtained by reacting principally metal silicon (purity: about 98% by weight or more) for industrial use with hydrogen chloride and/or chlorine and then separating and refining the reaction product by using many multistage fractionating columns, and it is provided for use in optical fibers. However, carbon, boron and the like are contained as impurities in metal silicon for industrial use, which is used as the raw material, and an organic silicon compound, a boron compound and the like remain in silicon tetrachloride obtained and reduce the characteristics of high purity crystalline silicon, which is finally targeted. In order to prevent the above matter, silicon tetrachloride which is industrially used is further refined by using treating methods suited to the respective impurities, and it is used for the reaction as the high purity refined silicon tetrachloride described above.

A method for reducing a boron content in the silicon tetrachloride to preferably 0.1 ppbw or less, more preferably 0.05 ppbw or less can be carried out by a method in which silicon tetrachloride industrially used is introduced into an adsorbing equipment filled with silica gel and circulated at a temperature of 10 to 30° C. and a flow velocity of 100 to 2000 L/hour for 12 to 48 hours (net contact time with silica gel) in the adsorbing equipment.

A method for reducing an organic silicon compound content in the silicon tetrachloride to preferably 0.1 ppmw or less, more preferably 0.01 ppmw or less which is a detection limit is carried out by a method in which silicon tetrachloride industrially used is vaporized at 60 to 100° C. and then allowed to pass through a heating tube heated at a temperature of 600 to 1200° C. for a residence time of about 1 to 10 seconds to carbonize the organic silicon compound in the silicon tetrachloride and remove it and in which the silicon tetrachloride is then cooled, caught and further rectified. Alternatively, it is carried out by a method in which silicon tetrachloride industrially used is vaporized to prepare a mixed gas with oxygen and in which the mixed gas is allowed to pass through a metal-carried activated carbon catalyst layer adjusted at a temperature of 200 to 450° C. for a residence time of 1 to 30 seconds to remove the organic silicon compound in the silicon tetrachloride and then cooled, caught and further rectified.

Further, in the present invention, metal zinc having a purity of 99.99% by weight or more is preferably used as a raw material of the zinc gas used for reduction of the silicon tetrachloride gas in order to realize the purity of the high purity crystalline silicon.

Metal zinc is produced from ores such as blende and the like. Two methods of a dry method and a wet method are available as a method for refining metal zinc. The dry method includes a method in which the ore is heated at high temperature and turned into zinc oxide and in which it is then reduced by carbon to distil resulting zinc. Zinc obtained by the above method contains impurities such as iron, sulfur, lead and the like and therefore is further rectified to enhance a purity. Also, the wet method includes a method in which the ore heated is dissolved in sulfuric acid to remove impurities and in which the solution is electrolyzed. Zinc obtained by the above method has a high purity. Metal zinc satisfying the required purity may be selected from commercially available products and used.

A supplying proportion (mole ratio) of the silicon tetrachloride gas: the zinc gas in the production process of the present invention is, for example, 1:10 to 10:1. Further, a flow velocity of the silicon tetrachloride gas from the silicon tetrachloride gas-supplying nozzle is, for example, 800 to 1500 mm/second.

<Step (2)>

In the present step, the silicon tetrachloride gas and the zinc gas, which are supplied into the reactor, are reacted at 800 to 1200° C. to thereby form crude crystalline silicon at a chip part of the silicon tetrachloride gas-supplying nozzle.

<Step (3)>

In the present step, the crude crystalline silicon is grown downward from the chip part of the silicon tetrachloride gas-supplying nozzle. As shown in the schematic drawing of FIG. 1, the crude crystalline silicon 100 is formed at the chip part of the silicon tetrachloride gas-supplying nozzle 2 in a tubular form and grown downward without brought into contact with an inner wall surface of the vertical reactor, and therefore it is less susceptible to contamination exerted by a wall material of the reactor.

<Step (4)>

In the present step, the grown crude crystalline silicon is discharged to an outside of the vertical reactor. To be more specific, the grown crude crystalline silicon is allowed to fall to a cooling zone provided at a lower part of the vertical reactor by its own weight or a mechanical method and cooled, and then it is discharged batch-wise or continuously from a bottom part of the vertical reactor to an outside of the reactor. When the crude crystalline silicon is discharged batch-wise or continuously from a bottom part of the vertical reactor to an outside of the reactor, it is discharged preferably by the mechanical method.

In the production process of the present invention, the crude crystalline silicon is detached from the nozzle and falls by its own weight as it is grown, and therefore clogging and the like are not caused in the nozzle. Further, after it is grown to a suitable length, it can be allowed to fall continuously by a mechanical method such as vibration, scratching and the like. A lump of the crude crystalline silicon grown in a tubular form is amorphous and therefore liable to be crushed, and a bottom surface of the vertical reactor is scarcely damaged by falling, but for the sake of safety, it is preferably allowed to fall by the mechanical method after it is grown to a suitable length.

The cooling zone can be formed, for example, by supplying the silicon tetrachloride gas of 100 to 900° C. from a lower part of the vertical reactor. To be more specific, as shown in the schematic drawing of FIG. 1, the silicon tetrachloride gas of a low temperature (100 to 900° C.) is supplied as a sealing gas from sealing gas-introducing pipes 6a, 6b provided at a lower part of the vertical reactor 1, whereby the cooling zone 30 can be formed. The sealing gas (silicon tetrachloride gas) 20 heated goes up gradually while cooling the falling crude crystalline silicon by the cooling zone 30 thus formed and is overflown from the waste gas-discharging pipe 4 provided on a side face at a middle part of the reactor, whereby the crude crystalline silicon cooled can be discharged batch-wise or continuously to an outside of the reactor.

A zinc chloride gas formed by reaction of the silicon tetrachloride gas with the zinc gas, the unreacted silicon tetrachloride gas, the unreacted zinc gas and crude crystalline silicon fine powders accompanied thereby are discharged from the waste gas-discharging pipe 4 to an outside of the vertical reactor, and they are cooled, fractionated and reused. For example, zinc and chlorine are formed by subjecting zinc chloride to melt electrolysis. Zinc is reused as the reducing agent, and chlorine is reused for production of silicon tetrachloride.

<Step (5)>

In the present step, the discharged crude crystalline silicon is subjected to acid treatment. Zinc of the reducing agent and zinc chloride formed are adhered on a surface of the crude crystalline silicon obtained by the reductive reaction described above, and therefore the prescribed high purity crystalline silicon can be obtained by crushing the above crude crystalline silicon to a length (a particle diameter when the crude crystalline silicons are fused) of preferably 0.1 to 5 mm by means of a crusher and the like, subjecting the crushed product to acid treatment, washing it with purified water and drying it. If a length or a particle diameter of the crushed product falls in the range described above, the high purity crystalline silicon can smoothly be supplied to an ingot production equipment by means of an equipment for supplying powder and granular material (for example, a vibration feeder and the like) when the high purity crystalline silicon is molten in a crucible to produce a high purity single crystalline silicon ingot described later. Further, silicon raw material additional supplying equipment for high purity single crystalline silicon ingot-pulling equipment can suitably be used as well.

The acid treatment can be carried out either in a gas phase or a liquid phase. The acid used includes hydrochloric acid, nitric acid, hydrofluoric acid and the like. Among them, hydrochloric acid is preferred because of the reasons that it is easily reacted with zinc and that the reaction product is liable to be dissolved in purified water. In particular, a hydrochloric acid aqueous solution having a concentration of 0.5 to 10% by weight, preferably 1 to 5% by weight is desirable since it changes efficiently zinc adhered on a surface of the crushed product of the crude crystalline silicon to water-soluble zinc chloride.

The acid treatment by the hydrochloric acid aqueous solution is preferably carried out by putting the crushed product of the crude crystalline silicon in a washing bath filled with the hydrochloric acid aqueous solution to bring it into contact with the aqueous solution at a temperature of 20 to 80° C. for 1 to 20 minutes. Also, a use amount of the hydrochloric acid aqueous solution is preferably 5 to 20 kg per kg of the crushed product of the crude crystalline silicon. If a concentration, a use amount and the acid treating conditions of the hydrochloric acid aqueous solution fall in the ranges described above, impurities such as zinc of the reducing agent, zinc chloride formed and the like are removed, and the impurities dissolved in the hydrochloric acid aqueous solution are not adhered again on the crushed product of the crude crystalline silicon to make rinsing and washing easy.

After subjected to the acid treatment, the acid-treated product is put in a washing bath filled with purified water and dipped therein at a temperature of 20 to 80° C. for 1 to 20 minutes to wash it while pouring water, and then the washed product is preferably dried at 80 to 120° C. for 5 to 8 hours.

[High Purity Single Crystalline Silicon]

The high purity single crystalline silicon of the present invention is prepared from the high purity crystalline silicon obtained in the manner described above, and it has a carbon content of preferably 2 ppmw or less, more preferably 0.5 ppmw or less and a resistivity value $\rho$ of preferably 20 to 1000 $\Omega$-cm, more preferably 50 to 1000 $\Omega$-cm. This is a level, which can satisfy not only a quality required to a raw material of silicon for a solar cell but also apart of a quality required to silicon for an up-to-date semiconductor.

The high purity single crystalline silicon of the present invention is obtained in the form of an ingot of single crystalline silicon by melting the high purity crystalline silicon in a crucible and by a Czochralski process. The ingot is further sliced and processed into a wafer, and the wafer is used as a material of silicon for a semiconductor or as a material of silicon for a solar cell.

EXAMPLES

The present invention shall more specifically be explained below based on examples, but the present invention shall by no means be restricted to these examples.

The silicon tetrachloride, the high purity crystalline silicon and the high purity single crystalline silicon each obtained were analyzed and evaluated in the following manners.

1) Preparation of Test Piece (Silicon Wafer):

A high purity single crystalline silicon ingot was prepared from the high purity crystalline silicon by means of a Czochralski process single crystal-growing equipment. Further, the ingot was cut to a wafer having a thickness of 2 mm by means of an inner peripheral blade type slicer or a bandsaw to prepare a sample for measuring a resistivity and a sample for measuring a carbon content, a boron content and a zinc content.

2) Quantitative Determination of Metal Impurities:

Metal impurities contained in the silicon tetrachloride were quantitatively determined by a method in which ultrapure water and a small amount of $HNO_3$ were added to a residue obtained by vaporizing and drying up the silicon tetrachloride at 60° C. in a Teflon (registered trade name)-made vessel to dissolve it by heating and prepare a solution and in which the solution was quantitatively determined by means of a high frequency induction plasma mass spectrometer (ICP-MS, "Agilent 7500CS" manufactured by Agilent Technologies, Inc.). On the other hand, metal impurities contained in the high purity crystalline silicon and the high purity single crystalline silicon were quantitatively determined by a method in which metal impurities contained in a solution remaining after decomposing the silicons with $HF/HNO_3$ were quantitatively determined by means of the high frequency induction plasma mass spectrometer (ICP-MS, "Agilent 7500CS" manufactured by Agilent Technologies, Inc.).

The purities of the high purity crystalline silicon and the high purity single crystalline silicon were obtained by quantitatively determining metal elements (17 elements: Zn, Al, Ca, Cd, Cr, Cu, Co, Fe, Mn, Mo, Na, Ni, Pb, Sn, Ti, P and B) and deducting a sum of the determined values of the 17 elements from 100% by weight.

3) Quantitative Determination of Carbon:

A carbon amount in the silicon wafer was quantitatively determined by FT-IR according to JEITA EM-3503.

4) Quantitative Determination of Organic Silicon Compound Content:

The organic silicon compound content in the silicon tetrachloride was quantitatively determined by quantitatively analyzing four kinds of organic silicon compounds ($CH_3SiCl_3$, $(CH_3)_2SiCl_2$, $(CH_3)_3SiCl$ and $(CH_3)_2HSiCl$) by means of a gas chromatographic mass spectrometer to set a total amount thereof to the organic silicon compound content. The equipment used and the conditions thereof are described below.

GC-MS equipment: GCMS-QP2010 Plus (manufactured by Shimadzu Corporation)
Column: Inert Cap 5 (manufactured by GL Sciences Inc.)
Column size: inner diameter 0.32 mm, length 60 m
Column liquid layer: 5% diphenyl-95% dimethylpolysiloxane
Column liquid layer film thickness: 1.00 μm
Carrier gas: ultrahigh purity helium
Column temperature: 60° C.
Column flow amount: 2 ml/minute
Sample injection amount: 0.6 μl
Sample injection mode: split method
Split ratio: 20
Purge flow amount: 3 ml/minute
Sample vaporization chamber temperature: 130° C.
Ion source temperature: 230° C.
Measuring mode: SIM mode
Quantitative determination method: absolute calibration curve method 5) Measurement of Resistivity Value ρ:

Measurement was carried out according to JIS H 0602.

Example 1

<Production of High Purity Silicon Tetrachloride>

Silicon tetrachloride (organic silicon compound content: 3.5 ppmw, boron content: 0.14 ppbw) industrially used which was obtained by distilling a reaction product obtained by reacting metal silicon for industrial use (purity: about 98% by weight) with hydrogen chloride was used for the silicon tetrachloride which was the raw material. The silicon tetrachloride was introduced into an adsorbing column filled with 20 kg of silica gel and circulated at a temperature of 20° C. and a flow amount of 1000 L/hour for 24 hours to reduce a boron content. The silicon tetrachloride after the adsorbing treatment had a boron content of 0.05 ppbw or less which was a detection limit. Further, after vaporized at 100° C., the silicon tetrachloride was allowed to pass through an overheating tube heated at a temperature of 1100° C. in a residence time of 1 second to remove the organic silicon compounds by carbonization, and then it was cooled, caught and further rectified. An organic silicon compound content in the silicon tetrachloride before treated was 3.5 ppmw, and it was reduced to 0.01 ppmw or less after treated. The boron and organic silicon compound contents in the silicon tetrachloride before and after the refining treatment are shown in Table 1.

<Production of Crude Crystalline Silicon>

The silicon tetrachloride after the refining treatment described above (refer to Table 1) was used as the silicon tetrachloride which was the raw material, and a test production equipment shown schematically in FIG. 1 was used to carry out a production test of the crystalline silicon.

The test production equipment used shall more specifically be explained with reference to FIG. 1. A reactor 1 had a structure in which a quartz-made cylinder having an inner diameter of 200 mm and a length of 3350 mm was combined with a stainless-made cylinder having an inner diameter of 200 mm and a length of 1300 mm provided on a lower side thereof. A waste gas-discharging tube 4 having an inner diameter of 40 mm and a length of 700 mm was provided in a position apart by 2000 mm from an upper part of the reactor 1, and a sealing gas-introducing port was provided in a position apart by 3500 mm therefrom. One nozzle of a quartz-made silicon tetrachloride gas-supplying nozzle 2 having an inner diameter of 20 mm, which was processed so that a tip thereof was tapered, was inserted into a central part of a ceiling in the reactor 1. Further, quartz-made zinc gas-supplying nozzles 3 (two nozzles) having an inner diameter of 20 mm were inserted in a position apart by 60 mm from the center toward a circumferential direction so that the silicon tetrachloride gas-supplying nozzle 2 was interposed between them. An aperture of the silicon tetrachloride gas-supplying nozzle 2 was set in a position apart by 250 mm from the ceiling part, and an aperture of the quartz-made zinc gas-supplying nozzle 3 was set in a position apart by 215 mm from the ceiling part. The constitution described above set a height of a reductive reaction layer 10 to 2000 mm, a height of a sealing gas-heating layer 20 to 1500 mm and a height of a storing layer (cooling zone 30) to 1150 mm.

The test was carried out in the following manner. First, an inside of the reactor was substituted with a high purity nitrogen gas (purity: 99.9999 vol-%), and then a temperature of a reactor heating furnace 40 installed in a periphery thereof was elevated to heat the reactor so as to control a temperature of the reductive reaction layer 10 to 950° C., an upper layer temperature of the sealing gas-heating layer 20 to 950° C., a lower layer temperature of the sealing gas-heating layer 20 to 100° C. and a temperature of the storing layer 30 to 100° C. to maintain the temperatures. The silicon tetrachloride gas heated to 110° C. was introduced in the above state from the sealing gas-introducing port at a rate of 1.5 kg/hour (8 mm/second, 950° C.) to fill the inside with the gas, and the sealing layer in a lower part of the reaction layer was provided with an upward linear velocity. Further, introduced so that a mole ratio of silicon tetrachloride:zinc was 0.6:1 were the silicon tetrachloride gas heated to 950° C. from the silicon tetrachloride gas-supplying nozzle 2 and the zinc (purity: 99.99% by weight) gas heated to 950° C. from the zinc gas-supplying nozzle 3. The reaction was continued for 30 hours on the above conditions. A velocity of silicon tetrachloride at the nozzle outlet fell in a range of 1000 to 1500 mm/second, and a velocity of zinc at the nozzle tip fell in a range of 900 to 1300 mm/second.

After finishing the reaction, supplying of the zinc gas and the silicon tetrachloride and introduction of the sealing gas were terminated, and an inside of the reactor was substituted with a high purity nitrogen gas and cooled. Then, the storing layer was opened to confirm that three bars of crude crystalline silicon, which was aggregated in a tubular form, fell in the inside. Further, crude crystalline silicon in the middle of growing was observed at a tip of the silicon tetrachloride gas-supplying nozzle. A weight of the crude crystalline silicon, which fell and was obtained, was 8.5 kg. A temperature of the storing layer was maintained at the set temperature during continuing the reaction, and the temperature was not observed to be extremely elevated.

<Acid Treatment of Crude Crystalline Silicon>

The crude crystalline silicon obtained by opening the storing layer was crushed by means of a crusher. The crushed crude crystalline silicon was observed under a microscope to result in finding that a particle diameter thereof was 0.1 to 5 mm. Next, 2 kg of the crushed crude crystalline silicon was dipped in a vessel containing 20 kg of a hydrochloric acid aqueous solution of 2% by weight and subjected to acid treatment at 25° C. for 10 minutes by shaking and stirring, and then the acid treated-product was separated from the hydrochloric acid aqueous solution, dipped in a vessel containing 20 kg of purified water and washed at 25° C. for 1 hour by shaking and stirring while pouring purified water. Then, the washed product was separated from purified water and dried at 80° C. for 8 hours.

The particles of the high purity crystalline silicon obtained by passing through the acid treating step were analyzed by an X ray diffraction analytical method to confirm a (111) face of the crystal, and a diameter of a cross section of the (111) face was measured under a microscope to result in finding that it was 0.1 to 5 mm. Further, a boron content and a zinc content of the high purity crystalline silicon were analyzed by the method described above. The results thereof are shown in Table 1.

The high purity crystalline silicon 40 kg obtained by the method described above was filled in a crucible having a capacity of 48 L, and a silicon single crystal having a diameter of about 150 mm and a weight of 30 kg was obtained at 1420° C. in 20 hours by a Czochralski method using an apparatus manufactured by Mitsubishi Materials Techno Corporation. The high purity single crystalline silicon was sliced by means of a slicer manufactured by Tokyo Seimitsu Co., Ltd. to obtain a silicon wafer having a thickness of 2 mm. The results thereof are shown in Table 1.

Example 2

<Production of High Purity Silicon Tetrachloride>

Silicon tetrachloride (organic silicon compound content: 4.6 ppmw, boron content: 8 ppbw) industrially used which was obtained by distilling a reaction product obtained by reacting metal silicon for industrial use (purity: about 98% by weight) with hydrogen chloride was used for the silicon tetrachloride which was the raw material. The silicon tetrachloride was introduced into an adsorbing column filled with 20 kg of silica gel and circulated at a temperature of 20° C. and a flow amount 1200 L/hour for 20 hours to reduce a boron content. The silicon tetrachloride after the adsorbing treatment had a boron content of 0.05 ppbw or less which was a detection limit. Further, after vaporized at 100° C., the silicon tetrachloride was allowed to pass through an overheating tube heated at a temperature of 1200° C. in a residence time of 1 second to remove the organic silicon compounds by carbonization, and then it was cooled, caught and further rectified. An organic silicon compound content in the silicon tetrachloride before treated was 4.6 ppmw, and it was reduced to 0.1 ppmw after treated. The boron and organic silicon compound contents in the silicon tetrachloride before and after the refining treatment are shown in Table 1.

<Production of Crude Crystalline Silicon>

The silicon tetrachloride after the refining treatment described above (refer to Table 1) was used as the silicon tetrachloride which was the raw material, and the test production equipment used in Example 1 was used to carry out a production test of the crystalline silicon.

The test was carried out in the following manner. First, an inside of the reactor was substituted with a high purity nitrogen gas (purity: 99.9999 vol-%), and then a temperature of the reactor-heating furnace 40 installed in a periphery thereof was elevated to heat the reactor so as to control a temperature of the reductive reaction layer 10 to 950° C., an upper layer temperature of the sealing gas-heating layer 20 to 950° C., a lower layer temperature of the sealing gas-heating layer 20 to 100° C. and a temperature of the storing layer 30 to 100° C. to maintain the temperatures. The silicon tetrachloride gas heated to 100° C. was introduced in the above state from the sealing gas-introducing port at a rate of 2 kg/hour (10 mm/second, 950° C.) to fill the inside with the gas, and the sealing layer in a lower part of the reaction layer was provided with an upward linear velocity. Further, introduced so that a mole ratio of silicon tetrachloride:zinc was 0.6:1 were the silicon tetrachloride gas heated to 950° C. from the silicon tetrachloride gas-supplying nozzle 2 and the zinc (purity: 99.99% by weight) gas heated to 950° C. from the zinc gas-supplying nozzle 3. The reaction was continued for 20 hours on the above conditions. A velocity of silicon tetrachloride at the nozzle outlet fell in a range of 1000 to 1500 mm/second, and a velocity of zinc at the nozzle tip fell in a range of 900 to 1300 mm/second.

After finishing the reaction, supplying of the zinc gas and the silicon tetrachloride and introduction of the sealing gas were terminated, and an inside of the reactor was substituted with a high purity nitrogen gas and cooled. Then, the storing layer was opened to confirm that three bars of crude crystalline silicon, which was aggregated in a tubular form, fell in the inside. Further, crude crystalline silicon in the middle of growing was observed at a tip of the silicon tetrachloride gas-supplying nozzle. A weight of the crude crystalline silicon, which fell and was obtained was 6 kg. A temperature of the storing layer was maintained at the set temperature during continuing the reaction, and the temperature was not observed to be extremely elevated.

<Acid Treatment of Crude Crystalline Silicon>

The crude crystalline silicon obtained by opening the storing layer was crushed by means of a crusher. The crushed crude crystalline silicon was observed under a microscope to result in finding that a particle diameter thereof was 0.1 to 5 mm. Next, 2 kg of the crushed crude crystalline silicon was dipped in a vessel containing 20 kg of a hydrochloric acid aqueous solution of 2% by weight and subjected to acid treatment at 25° C. for 10 minutes by shaking and stirring, and then the acid treated-product was separated from the hydrochloric acid aqueous solution, dipped in a vessel containing 20 kg of purified water and washed at 25° C. for 1 hour by shaking and stirring while pouring purified water. Then, the washed product was separated from purified water and dried at 80° C. for 8 hours.

The particles of the high purity crystalline silicon obtained by passing through the acid treating step were analyzed by an X ray diffraction analytical method to confirm a (111) face of the crystal, and a diameter of a cross section of the (111) face was measured under a microscope to result in finding that it was 0.1 to 5 mm. Further, a boron content and a zinc content of the high purity crystalline silicon were analyzed by the method described above. The results thereof are shown in Table 1.

The high purity crystalline silicon 40 kg obtained by the method described above was filled in a crucible having a capacity of 48 L, and a silicon single crystal having a diameter of about 150 mm and a weight of 30 kg was obtained at 1420° C. in 20 hours by the Czochralski method using the apparatus manufactured by Mitsubishi Materials Techno Corporation. The high purity single crystalline silicon was sliced by means of the slicer manufactured by Tokyo Seimitsu Co., Ltd. to obtain a silicon wafer having a thickness of 2 mm. The results thereof are shown in Table 1.

Example 3

<Production of High Purity Silicon Tetrachloride>

Silicon tetrachloride (organic silicon compound content: 11.7 ppmw, boron content: 2 ppbw) industrially used which was obtained by distilling a reaction product obtained by reacting metal silicon for industrial use (purity: about 98% by weight) with hydrogen chloride was used for the silicon tetrachloride which was the raw material. The silicon tetrachloride was introduced into an adsorbing column filled with 30 kg of silica gel and circulated at a temperature of 20° C. and a flow amount 1100 L/hour for 24 hours to reduce a boron content. The silicon tetrachloride after the adsorbing treatment had a boron content of 0.05 ppbw or less which was a detection limit. Further, after vaporized at 100° C., the silicon tetrachloride was allowed to pass through an overheating tube heated at a temperature of 1200° C. in a residence time of 3 seconds to remove the organic silicon compounds by carbonization, and then it was cooled, caught and further rectified. An organic silicon compound content in the silicon tetrachloride before treated was 11.7 ppmw, and it was reduced to 0.01 ppmw or less after treated. The boron and organic silicon compound contents in the silicon tetrachloride before and after the refining treatment are shown in Table 1.

<Production of Crude Crystalline Silicon>

The silicon tetrachloride after the refining treatment described above (refer to Table 1) was used as the silicon tetrachloride which was the raw material, and the test production equipment used in Example 1 was used to carry out a production test of the crystalline silicon.

The test was carried out in the following manner. First, an inside of the reactor was substituted with a high purity nitrogen gas (purity: 99.9999 vol-%), and then a temperature of the reactor-heating furnace 40 installed in a periphery thereof was elevated to heat the reactor so as to control a temperature of the reductive reaction layer 10 to 950° C., an upper layer temperature of the sealing gas-heating layer 20 to 950° C., a lower layer temperature of the sealing gas-heating layer 20 to 100° C. and a temperature of the storing layer 30 to 100° C. to maintain the temperatures. The silicon tetrachloride gas heated to 110° C. was introduced in the above state from the sealing gas-introducing port at a rate of 3 kg/hour (15 mm/second, 950° C.) to fill the inside with the gas, and the sealing layer in a lower part of the reaction layer was provided with an upward linear velocity. Further, introduced so that a mole ratio of silicon tetrachloride:zinc was 0.6:1 were the silicon tetrachloride gas heated to 950° C. from the silicon tetrachloride gas-supplying nozzle 2 and the zinc (purity: 99.99% by weight) gas heated to 950° C. from the zinc gas-supplying nozzle 3. The reaction was continued for 25 hours on the above conditions. A velocity of silicon tetrachloride at the nozzle outlet fell in a range of 1000 to 1500 mm/second, and a velocity of zinc at the nozzle tip fell in a range of 900 to 1300 mm/second.

After finishing the reaction, supplying of the zinc gas and the silicon tetrachloride and introduction of the sealing gas were terminated, and an inside of the reactor was substituted with a high purity nitrogen gas and cooled. Then, the storing layer was opened to confirm that three bars of crude crystalline silicon, which was aggregated in a tubular form, fell in the inside. Further, crude crystalline silicon in the middle of growing was observed at a tip of the silicon tetrachloride gas-supplying nozzle. A weight of the crude crystalline silicon, which fell and was obtained, was 8 kg. A temperature of the storing layer was maintained at the set temperature during continuing the reaction, and the temperature was not observed to be extremely elevated.

<Acid Treatment of Crude Crystalline Silicon>

The crude crystalline silicon obtained by opening the storing layer was crushed by means of a crusher. The crushed crude crystalline silicon was observed under a microscope to result in finding that a particle diameter thereof was 0.1 to 5 mm. Next, 2 kg of the crushed crude crystalline silicon was dipped in a vessel containing 20 kg of a hydrochloric acid aqueous solution of 2% by weight and subjected to acid treatment at 25° C. for 10 minutes by shaking and stirring, and then the acid treated-product was separated from the hydrochloric acid aqueous solution, dipped in a vessel containing 20 kg of purified water and washed at 25° C. for 1 hour by shaking and stirring while pouring purified water. Then, the washed product was separated from purified water and dried at 80° C. for 8 hours.

The particles of the high purity crystalline silicon obtained by passing through the acid treating step were analyzed by an X ray diffraction analytical method to confirm a (111) face of the crystal, and a diameter of a cross section of the (111) face was measured under a microscope to result in finding that it was 0.1 to 5 mm. Further, a boron content and a zinc content of the high purity crystalline silicon were analyzed by the method described above. The results thereof are shown in Table 1.

The high purity crystalline silicon 40 kg obtained by the method described above was filled in a crucible having a capacity of 48 L, and a silicon single crystal having a diameter of about 150 mm and a weight of 30 kg was obtained at 1420°

15

C. in 20 hours by the Czochralski method using the apparatus manufactured by Mitsubishi Materials Techno Corporation. The high purity single crystalline silicon was sliced by means of the slicer manufactured by Tokyo Seimitsu Co, Ltd. to obtain a silicon wafer having a thickness of 2 mm. The results thereof are shown in Table 1.

Example 4

<Production of High Purity Silicon Tetrachloride>

Silicon tetrachloride (organic silicon compound content: 15 ppmw, boron content: 3 ppbw) industrially used which was obtained by distilling a reaction product obtained by reacting metal silicon for industrial use (purity: about 98% by weight) with hydrogen chloride was used for the silicon tetrachloride which was the raw material. The silicon tetrachloride was introduced into an adsorbing column filled with 30 kg of silica gel and circulated at a temperature of 20° C. and a flow amount 1000 L/hour for 30 hours to reduce a boron content. The silicon tetrachloride after the adsorbing treatment had a boron content of 0.05 ppbw or less which was a detection limit. Further, after vaporized at 100° C., the silicon tetrachloride was allowed to pass through an overheating tube heated at a temperature of 1200° C. in a residence time of 3 seconds to remove the organic silicon compounds by carbonization, and then it was cooled, caught and further rectified. An organic silicon compound content in the silicon tetrachloride before treated was 15 ppmw, and it was reduced to 0.01 ppmw or less after treated. The boron and organic silicon compound contents in the silicon tetrachloride before and after the refining treatment are shown in Table 1.

<Production of Crude Crystalline Silicon>

The silicon tetrachloride after the refining treatment described above (refer to Table 1) was used as the silicon tetrachloride which was the raw material, and the same equipment shown schematically in FIG. 1 as the test production equipment used in Example 1 was used to carry out a production test of the crystalline silicon.

The test was carried out in the following manner. First, an inside of the reactor was substituted with a high purity nitrogen gas (purity: 99.9999 vol-%), and then a temperature of the reactor-heating furnace 40 installed in a periphery thereof was elevated to heat the reactor so as to control a temperature of the reductive reaction layer 10 to 950° C., an upper layer temperature of the sealing gas-heating layer 20 to 950° C., a lower layer temperature of the sealing gas-heating layer 20 to 100° C. and a temperature of the storing layer 30 to 100° C. to maintain the temperatures. The silicon tetrachloride gas heated to 100° C. was introduced in the above state from the sealing gas-introducing port at a rate of 2 kg/hour (10 mm/second, 950° C.) to fill the inside with the gas, and the sealing layer in a lower part of the reaction layer was provided with an upward linear velocity. Further, introduced so that a mole ratio of silicon tetrachloride:zinc was 0.6:1 were the silicon tetrachloride gas heated to 950° C. from the silicon tetrachloride gas-supplying nozzle 2 and the zinc (purity: 99.99% by weight) gas heated to 950° C. from the zinc gas-supplying nozzle 3. The reaction was continued for 20 hours on the above conditions. A velocity of silicon tetrachloride at the nozzle outlet fell in a range of 1000 to 1500 mm/second, and a velocity of zinc at the nozzle tip fell in a range of 900 to 1300 mm/second.

16

After finishing the reaction, supplying of the zinc gas and the silicon tetrachloride gas and introduction of the sealing gas were terminated, and an inside of the reactor was substituted with a high purity nitrogen gas and cooled. Then, the storing layer was opened to confirm that three bars of crude crystalline silicon, which was aggregated in a tubular form, fell in the inside. Further, crude crystalline silicon in the middle of growing was observed at a tip of the silicon tetrachloride gas-supplying nozzle. A weight of the crude crystalline silicon, which fell and was obtained, was 9 kg. A temperature of the storing layer was maintained at the set temperature during continuing the reaction, and the temperature was not observed to be extremely elevated.

<Acid Treatment of Crude Crystalline Silicon>

The crude crystalline silicon obtained by opening the storing layer was crushed by means of a crusher. The crushed crude crystalline silicon was observed under a microscope to result in finding that a particle diameter thereof was 0.1 to 5 mm. Next, 2 kg of the crushed crude crystalline silicon was dipped in a vessel containing 20 kg of a hydrochloric acid aqueous solution of 2% by weight and subjected to acid treatment at 25° C. for 10 minutes by shaking and stirring, and then the acid treated-product was separated from the hydrochloric acid aqueous solution, dipped in a vessel containing 20 kg of purified water and washed at 25° C. for 1 hour by shaking and stirring while pouring purified water. Then, the washed product was separated from purified water and dried at 80° C. for 8 hours.

The particles of the high purity crystalline silicon obtained by passing through the acid treating step were analyzed by an X ray diffraction analytical method to confirm a (111) face of the crystal, and a diameter of a cross section of the (111) face was measured under a microscope to result in finding that it was 0.1 to 5 mm. Further, a boron content and a zinc content of the high purity crystalline silicon were analyzed by the method described above. The results thereof are shown in Table 1.

The high purity crystalline silicon 40 kg obtained by the method described above was filled in a crucible having a capacity of 48 L, and a silicon single crystal having a diameter of about 150 mm and a weight of 30 kg was obtained at 1420° C. in 20 hours by the Czochralski method using the apparatus manufactured by Mitsubishi Materials Techno Corporation. The high purity single crystalline silicon was sliced by means of the slicer manufactured by Tokyo Seimitsu Co., Ltd. to obtain a silicon wafer having a thickness of 2 mm. The results thereof are shown in Table 1.

Comparative Example 1

The same procedure as in Example 1 was carried out, except that silicon tetrachloride before the refining treatment described above (refer to Table 1) was used as the silicon tetrachloride and that used was high purity crystalline silicon obtained by carrying out washing with purified water and drying without carrying out the acid treatment by using the hydrogen chloride aqueous solution. The results thereof are shown in Table 1.

TABLE 1

|  |  |  | Example 1 | Example 2 | Example 3 | Example 4 | Comparative Example 1 |
|---|---|---|---|---|---|---|---|
| Silicon tetrachloride before refining treatment | Boron content | (ppbw) | 0.14 | 8.0 | 2.0 | 3.0 | 2.5 |
|  | Organic silicon compound content | (ppmw) | 3.5 | 4.6 | 11.7 | 15 | 16 |
| High purity silicon tetrachloride | Boron content | (ppbw) | <0.05* | <0.05* | <0.05* | <0.05* | — |
|  | Organic silicon compound content | (ppmw) | <0.01* | 0.1 | <0.01* | <0.01* | — |
| Metal zinc | Purity | (wt %) | 99.999 | 99.999 | 99.999 | 99.999 | 99.999 |
| High purity crystalline silicon | Boron content | (ppbw) | <10* | <10* | <10* | <10* | 20 |
|  | Zinc content | (ppmw) | 0.9 | 0.6 | 0.5 | 0.5 | 5.0 |
| High purity single crystalline silicon | Carbon content | (ppmw) | 0.5 | 0.6 | 0.1 | 0.5 | 2.0 |
|  | Boron content | (ppbw) | <10* | <10* | <10* | <10* | 20 |
|  | Zinc content | (ppbw) | <10* | <10* | <10* | <10* | <10* |
|  | Purity | (ppbw) | 99.9999<** | 99.9999<** | 99.9999<** | 99.9999<** | 99.9999<** |
|  | Resistivity value | (Ω-cm) | 40 | 24 | 100 | 200 | 4.0 |

*It means a detection limit or less
**Purity was shown taking a detection limit in the quantitative determination method described above into consideration Explanation of Codes
1: Vertical reactor
2: Silicon tetrachloride gas-supplying nozzle
3: Zinc gas-supplying nozzle
4: Waste gas-discharging pipe
5: Crude crystalline silicon-recovering equipment
6a: Sealing gas (silicon tetrachloride)-introducing pipe (1)
6b: Sealing gas (silicon tetrachloride)-introducing pipe (2)
6c: Sealing gas (silicon tetrachloride)-heating & supplying equipment
7: Silicon tetrachloride-vaporizing equipment
8a: Zinc melting furnace
8b: Zinc vaporizing furnace
9: Heater
10: Reductive reaction layer
20: Heated sealing gas (silicon tetrachloride) layer
30: Cooling zone
40: Reactor heating furnace
50: Zinc chloride-recovering tank
60: Silicon tetrachloride-condensing equipment
100: Tubular crude crystalline silicon
A: Zinc
B: Silicon tetrachloride
C: Crude crystalline silicon
D: Solid matter (zinc chloride+unreacted zinc+fine powdery silicon)
E: Sealing gas (silicon tetrachloride)
F: Gas component (unreacted silicon tetrachloride+sealing gas (silicon tetrachloride))
G: Gas treating equipment

The invention claimed is:

1. A production process for high purity crystalline silicon, which is a process for producing a high purity crystalline silicon having a boron content of 0.015 ppmw or less and a zinc content of 50 to 1000 ppbw, comprising:

(1) a step in which in a vertical reactor equipped with a silicon tetrachloride gas-supplying nozzle, a zinc gas-supplying nozzle and a waste gas-discharging pipe, the silicon tetrachloride gas-supplying nozzle being inserted into an inside of the reactor from an upper part thereof and set therein, a silicon tetrachloride gas is supplied from the silicon tetrachloride gas-supplying nozzle and a zinc gas is supplied from the zinc gas-supplying nozzle, (2) a step in which the silicon tetrachloride gas is reacted with the zinc gas at 800 to 1200° C. to thereby form crude crystalline silicon at a chip part of the silicon tetrachloride gas-supplying nozzle, (3) a step in which the crude crystalline silicon is grown downward from the chip part of the silicon tetrachloride gas-supplying nozzle, (4) a step in which the grown crude crystalline silicon is discharged to an outside of the vertical reactor and (5) a step in which the discharged crude crystalline silicon is subjected to acid treatment, wherein high purity silicon tetrachloride having an organic silicon compound content of 0.1 ppmw or less and a boron content of 0.1 ppbw or less is used as a raw material of the silicon tetrachloride gas, and metal zinc having a purity of 99.99% by weight or more is used as a raw material of the zinc gas.

2. The production process for high purity crystalline silicon of claim 1, wherein the step (5) comprises a step for crushing the discharged crude crystalline silicon, a step for subjecting the crushed crude crystalline silicon to acid treatment, a step for washing the acid-treated product and a step for drying the washed product.

3. The production process for high purity crystalline silicon of claim 1, wherein the step (5) comprises a step for subjecting the crude crystalline silicon crushed to a particle diameter of 0.1 to 5 mm to acid treatment and a step for washing the acid-treated product with purified water.

4. The production process for high purity crystalline silicon of claim 2, wherein the step (5) comprises a step for subjecting the crude crystalline silicon crushed to a particle diameter of 0.1 to 5 mm to acid treatment and a step for washing the acid-treated product with purified water.

* * * * *